United States Patent [19]

Parmer et al.

[11] 4,380,360

[45] Apr. 19, 1983

[54] CARTRIDGE, HOLDER AND CONNECTOR SYSTEM

[75] Inventors: Kenneth R. Parmer, Harrisburg; William J. Stape, Lewisberry, both of Pa.

[73] Assignee: AMP Incorporated, Harrisburg, Pa.

[21] Appl. No.: 269,939

[22] Filed: Jun. 3, 1981

[51] Int. Cl.³ .......................................... H01R 23/70
[52] U.S. Cl. ........................ 339/17 CF; 339/17 LC; 339/17 LM; 339/176 MP
[58] Field of Search ........ 339/17 LF, 17 LC, 17 LM, 339/17 M, 75 M, 91 R, 113 R, 113 L, 176 M, 176 MP, 184 R, 184 M, 186 R, 186 M, 206 R, 210 R, 210 M, 211

[56] References Cited

U.S. PATENT DOCUMENTS

| | | | |
|---|---|---|---|
| 3,858,957 | 1/1975 | Harwood et al. | 339/176 MP |
| 3,966,290 | 6/1976 | Little et al. | 339/17 LC |
| 4,264,114 | 4/1981 | Chandler | 339/17 LC |
| 4,329,008 | 5/1982 | Braginetz | 339/17 LC |
| 4,345,813 | 8/1982 | Hatch | 339/184 M |

FOREIGN PATENT DOCUMENTS 832658   4/1960   United Kingdom ............ 339/184 R

*Primary Examiner*—John McQuade
*Attorney, Agent, or Firm*—Russell J. Egan

[57] ABSTRACT

A cartridge, cartridge holder and connector system are disclosed formed primarily of two components, namely, an electronic component carrying cartridge and an assembly for receiving the cartridge and interconnecting it as an addition to existing equipment. The holder assembly includes a housing of rigid insulative material defining a cartridge receiving cavity and including means for interconnecting the cartridge to a circuit board or the like. The holder also includes a profiled and polarized entry leading to the cassette cartridge cavity. The cartridge is formed by a pair of mating housing members which enclose a circuit board having a plurality of components mounted thereon. An edge portion of the circuit board is accessible from one end of the cartridge so that when the cartridge is inserted into the cavity of the holder there is an electrical interconnection effected.

8 Claims, 3 Drawing Figures

CARTRIDGE, HOLDER AND CONNECTOR SYSTEM

The present invention relates to a system for mounting a component carrying cartridge on and connecting it to an existing electronic system.

There is a growing need in the electronic equipment area to be able to accommodate memory and other add-on components in the form of cartridges so that primary or existing equipment can be readily adapted to perform a wide variety of new or further functions. An example of this would be a cartridge carrying tape having a computer program thereon and which cartridges would be inserted into a portion of a computer to run a specific program. Likewise, a cartridge could contain an information storage system, such as a bubble memory, and be inserted into a computer in order to supply it with specific information relating to a particular program and/or to provide additional storage for information being processed by the computer. Heretofore, systems that were capable of handling cartridges have not had the desired versatility and/or were extremely expensive.

The present invention relates to a cartridge, holder and connector system utilized to detachably connect an electronic component carrying cartridge to a main equipment unit. The subject assembly includes a cartridge holder which is adapted to be mounted on a circuit board or like portion of the main equipment unit and defines a cavity for receiving the cartridge therein. The holder includes electrical interconnecting means effecting electrical connection with the circuit board or the like and having the ability to intermate with the cartridge received therein. The holder also includes a face plate defining a polarized and keyed entry to the cavity. The cartridge has mating housing members defining a circuit assembly receiving cavity therebetween. The assembly includes a circuit board having a plurality of components mounted thereon with the assembly being securely positioned in the cartridge cavity with one edge portion of the circuit board being accessible through an end portion of the cartridge. The cartridge has an outer profile suitable to mate with the profiled opening of the cavity and also suitable for stacking the cartridges when not in use.

It is therefore an object of the present invention to produce an improved cartridge, holder and connector system which can be utilized to detachably mate any one of a plurality of information carrying cartridges to a main equipment unit in a ready and economic manner.

An embodiment of the present invention will now be described by way of example with reference to the accompanying drawings in which.

Figure 1:
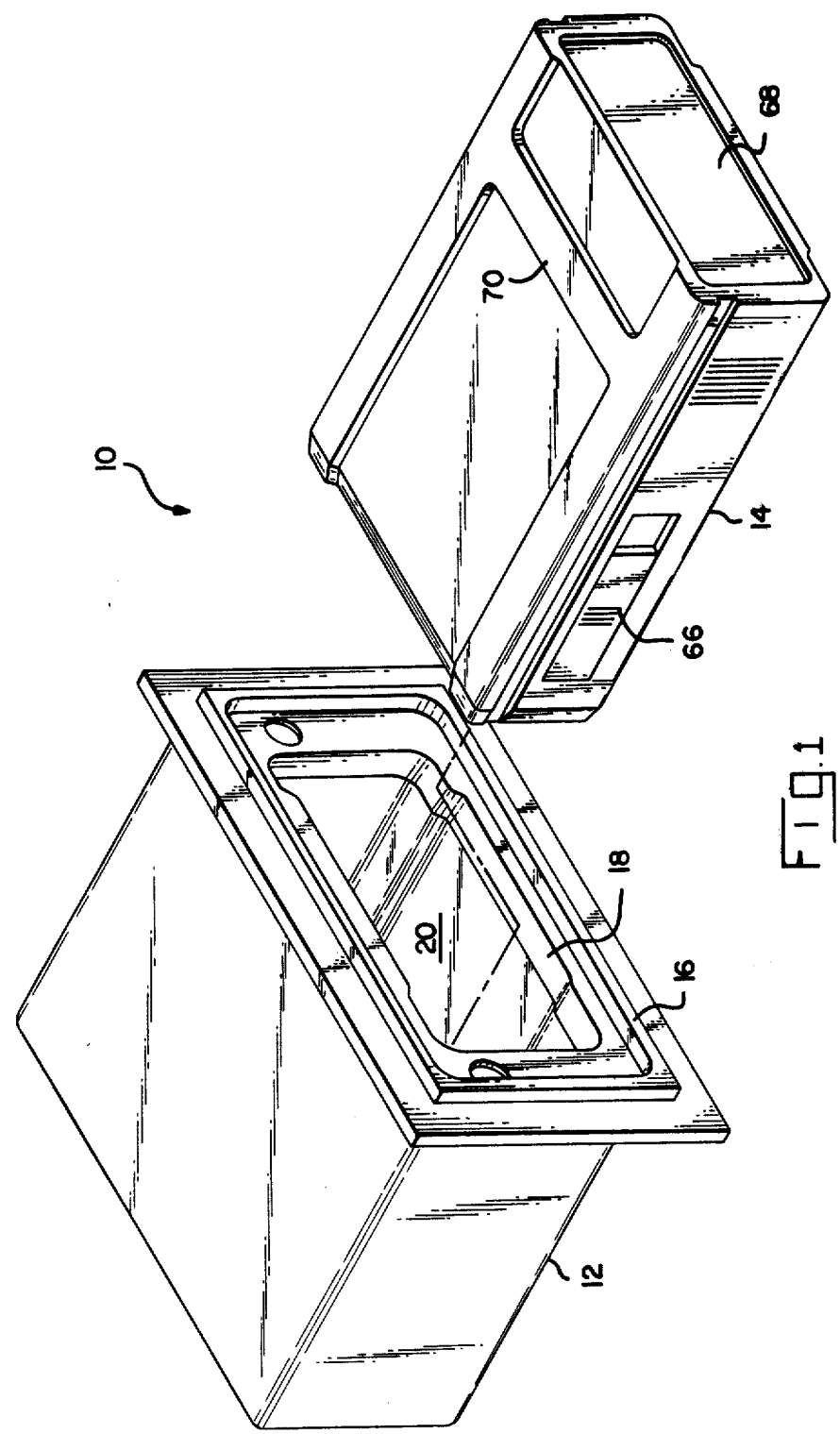
FIG. 1 is an exploded perspective view of a holder and cartridge according to the present invention.

The subject cartridge, holder and connector system 10 includes a holder 12 and a cartridge 14.

The holder 12 is a generally rectangular member formed of insulative material and has a front face 16 with a profiled opening 18 leading to a cavity 20. At the opposite end of the cavity 20 from the front face 16, there is an integral connector portion 22 (see FIG. 2) enclosing a pair of spaced terminals 24, 26. Each of the terminals have first mating ends 28, 30 directed towards the cavity 20 in substantially parallel spaced relation and soldered tails 32, 34 extending out of the housing and angled to engage in appropriate apertures 36, 38 and with circuitry 40, 42 of circuit board 44. The front face 16 can be profiled for mounting in or on a panel 46 of a main piece of equipment (not shown).

The cartridge 14 is an elongated unit of generally rectangular configuration of insulative material having an outer profile adapted to be received in the profiled opening 18 and defining an internal cavity 48 which is at least partially open at the mating end 50 and has circuit assembly supporting means 52 inwardly directed therein. In this instance, the support means is shown as a partial peripherial inwardly directed channel. The circuit board assembly 54 includes a circuit board 56 a plurality of components such as a bubble memory 58 and resistor 60. The circuit board 56 includes a plurality of contact pads 62, 64 spaced to be received by the respective terminals 24, 26. The cartridge also includes a slide switch 66, which can be used to control the functions within the cartridge, an area 68 for receiving indicia and profiled top and bottom areas 70, 72, respectively to facilitate stacking.

Figure 2:
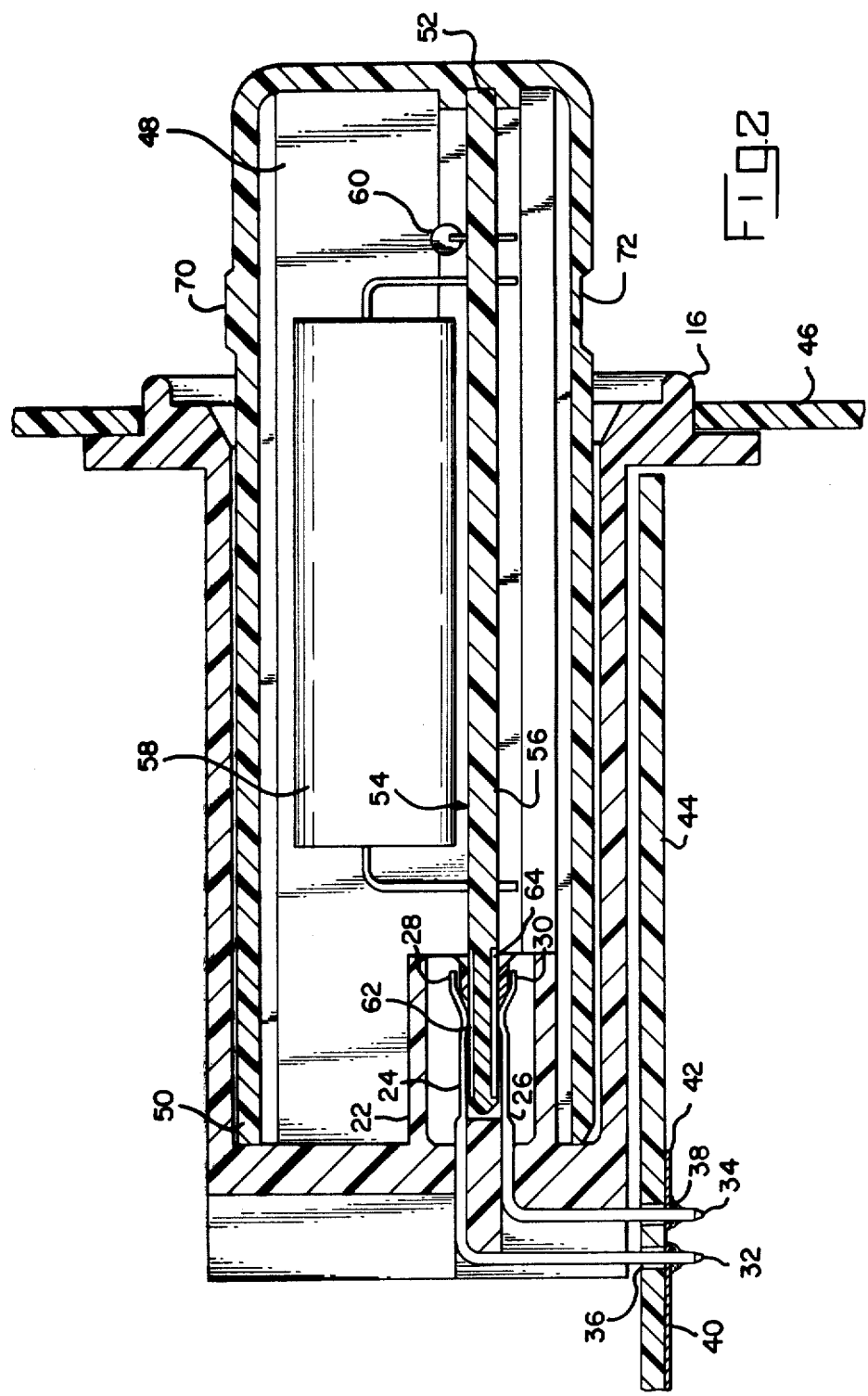
FIG. 2 is a longitudinal section through the mated cartridge and connector of FIG. 1.
Figure 3:
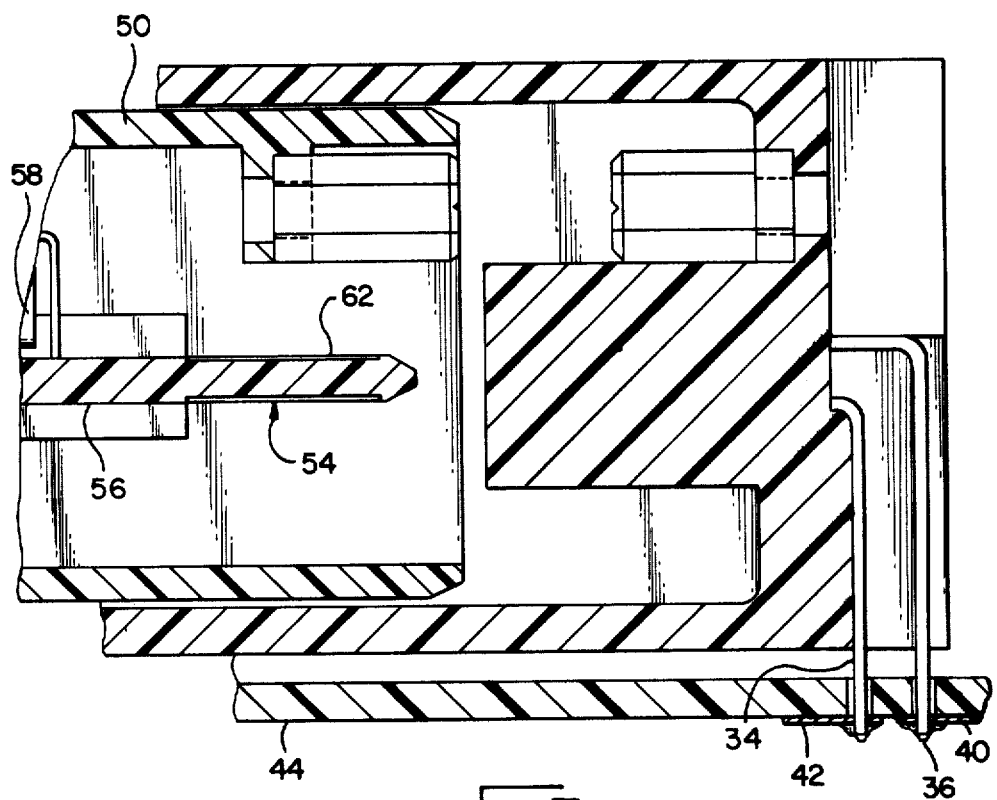
FIG. 3 is a detailed section showing the mating of the cartridge with the holder.

The operation of the device should be readily apparent from the drawings. The holder 12 is simply mounted on an edge portion of a circuit board 44 and joined to a panel 46. The appropriate circuit board assembly 54 is placed in a cartridge 14 and the desired cartridge 14 is simply inserted into the holder 12 as shown in FIGS. 1 and 2. The polarized and keyed entry 18 would prevent the insertion of an inappropriate cartridge into the holder.

The present invention may be subject to many modifications and changes without departing from the spirit or essential characteristics thereof. The present embodiment should therefore be considered in all respects as illustrative and not restrictive of the scope of the invention.

We claim:

1. A cartridge receiving holder and connector system comprising:
    a holder housing defining therein a cartridge receiving cavity, a front face defining a profiled opened entry to one end of said cavity, and connector means at the opposite end of said cavity directed therein and connected to circuits of external circuit means; and
    a cartridge having a housing with an outer profile receivable in said holder housing cavity and defining a cavity therein, a circuit board assembly received in said cartridge housing cavity and including a circuit board with components mounted thereon, one end of said circuit board being accessible through an open end of said cartridge housing cavity,
    whereby said cartridge is received in said holder cavity with the contacts of said holder engaging said circuit board through the open end of said cartridge cavity.

2. A cartridge receiving holder and connector system according to claim 1 wherein said connector means comprises:
    a plurality of terminals in two spaced apart rows defining an elongated circuit board engaging receptacle therebetween.

3. A cartridge receiving holder and connector system according to claim 1 wherein said connector means comprises:

a circuit board edge receptacle integral with said holder housing.

4. A cartridge receiving holder and connector system according to claim 1 wherein said holder housing comprises:

means for fixedly mounting said holder housing on said external circuit means.

5. A cartridge receiving holder and connector system according to claim 1 wherein said cartridge housing comprises:

a pair of mating housing members defining said cavity and having circuit board support means therein.

6. A cartridge receiving holder and connector system according to claim 5 wherein said circuit board support means comprises:

an inwardly directed channel extending about at least a portion of the periphery of said cartridge cavity.

7. A cartridge receiving holder and connector system according to claim 1 further comprising:

switch means external on said cartridge housing controlling function of the circuit board assembly carried thereby.

8. A cartridge receiving holder and connector system according to claim 1 wherein said cartridge housing has an external profile suitable for stacking.

* * * * *